United States Patent [19]

Guo

[11] Patent Number: 4,952,823

[45] Date of Patent: Aug. 28, 1990

[54] BICMOS DECODER

[75] Inventor: Tzen-Wen Guo, Milpitas, Calif.

[73] Assignee: Advanced Micro Devices, Inc., Sunnyvale, Calif.

[21] Appl. No.: 346,969

[22] Filed: May 3, 1989

[51] Int. Cl.$^5$ ............... H03K 19/01; H03K 19/003; H03K 19/082; H03K 19/094

[52] U.S. Cl. ................ 307/463; 307/446; 307/570; 307/449

[58] Field of Search ............. 307/449, 463, 446, 579, 307/443, 475, 450–453, 542, 544, 565–567, 264, 279; 365/177

[56] References Cited

U.S. PATENT DOCUMENTS

| | | | |
|---|---|---|---|
| 4,800,303 | 1/1989 | Graham et al. | 307/544 X |
| 4,804,868 | 2/1989 | Masada et al. | 307/446 |
| 4,837,462 | 6/1989 | Watanabe et al. | 307/449 X |
| 4,868,421 | 9/1989 | Herndon et al. | 307/446 |
| 4,882,534 | 11/1989 | Koshizuka | 307/446 X |
| 4,902,914 | 2/1990 | Masuoka | 307/446 |
| 4,912,347 | 3/1990 | Morris | 307/446 X |

Primary Examiner—Stanley D. Miller
Assistant Examiner—David R. Bertelson
Attorney, Agent, or Firm—Davis Chin

[57] ABSTRACT

A bipolar/CMOS decoder circuit for providing a decoded output signal includes a plurality of pull-up gate circuits (14a) and a pull-down circuit (16). Each of the gate circuite (14a) is formed of a pull-up P-channel MOS transistor (P1), a pull-down N-Channel MOS transistor (N1), and a pull-up bipolar transistor (Q11). The pull-down circuit (16) is formed of a single pull-down current source, N-channel MOS transistor (NØ). The bipolar transistors and CMOS transistors are merged in a common semiconductor substrate in order to form the decoder circuit which has a high noise margin and low pattern sensitivity even with a large number of inputs.

10 Claims, 1 Drawing Sheet

BICMOS DECODER

BACKGROUND OF THE INVENTION

This invention relates generally to decoder circuits having a large number of inputs, for example, the decoder used in redundancy circuits and more particularly, it relates to a BICMOS (bipolar/CMOS mixed type) decoder circuit which maintains a high noise margin and a low pattern sensitivity even with a large number of inputs.

Conventional decoder circuits employing only MOS (metal-oxide semiconductor) transistors are generally well known in the prior art. When such prior art decoder circuits are used, for example, in redundancy type circuits, there is required a relatively large number of inputs. As a result, these prior art decoder circuits suffer from the disadvantage of reduced noise margin and high pattern sensitivity when the number of decoder inputs increases.

It would therefore be desirable to provide a merged or composite bipolar/CMOS decoder circuit which has the advantages of high noise margin and low pattern sensitivity. The decoder circuit of the present invention is achieved by combining the bipolar transistor and CMOS transistor technologies together. As a result, bipolar transistors and CMOS transistors are merged or are arranged in a common semiconductor substrate in order to form an integrated circuit decoder device of the present invention.

SUMMARY OF THE INVENTION

Accordingly, it is a general object of the present invention to provide a bipolar/CMOS decoder circuit which is relatively simple and economical to manufacture and assemble, but yet overcomes the disadvantages of the prior art decoder circuits.

It is an object of the present invention to provide a bipolar/CMOS decoder circuit which maintains a high noise margin.

It is another object of the present invention to provide a bipolar/CMOS decoder circuit which has good pattern insensitivity even when the number of inputs become large.

It is still another object of the present invention to provide a bipolar/CMOS decoder circuit which is formed of a plurality of pull-up gate circuits and a pull-down circuit.

In accordance with these aims and objectives, the present invention is concerned with the provision of a bipolar/CMOS decoder circuit for generating a decoded output signal which includes a plurality of pull-up gate circuits and a pull-down circuit. Each of the gate circuits are formed of a pull-up P-channel MOS transistor, a pull-down N-channel MOS transistor, and a pull-up bipolar transistor. The pull-up P-channel transistor has its source connected to a supply potential, its gate connected to the gate of the pull-down N-channel transistor, and its drain connected to the drain of the pull-down N-channel transistor. The pull-down N-channel transistor has its source connected to a ground potential. The common gates of the P-channel and N-channel transistors are connected to receive an input logic signal. The bipolar transistor has its collector connected to the supply potential, its base connected to the common drains of the P-channel and N-channel transistors, and its emitter connected to a common emitter node for providing the decoded output signal. The pull-down circuit is formed of a single pull-down current source N-channel MOS transistor. The current source N-channel transistor has its drain connected to the common emitter node, its gate connected to a voltage source, and its source connected to the ground potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
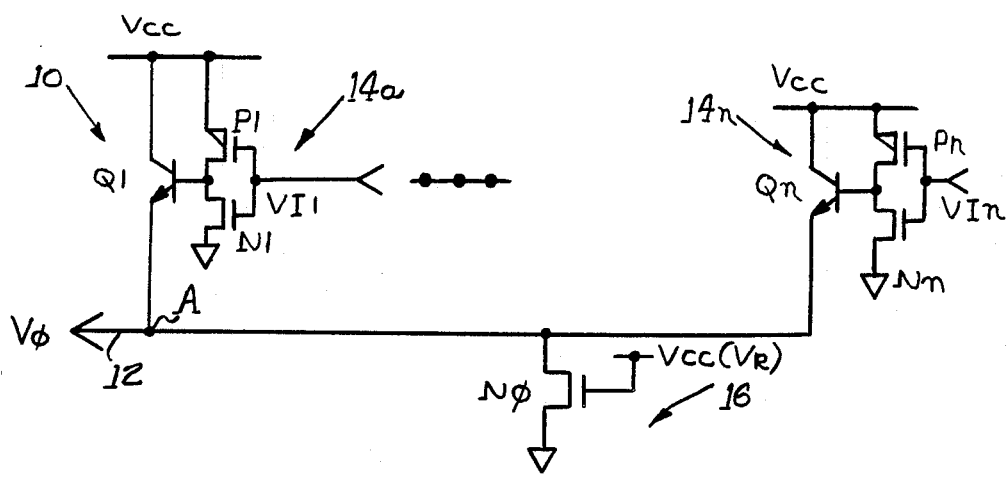
FIG. 1 is a schematic circuit diagram of a bipolar/CMOS decoder circuit of the present invention.

Referring now in detail to the drawings, there is shown in FIG. 1 a schematic circuit diagram of a BICMOS (bipolar/CMOS) decoder circuit 10 of the present invention for generating a decoded output signal V∅ on line 12. The decoder circuit 10 includes a plurality of pull-up gate circuits 14a through 14n and a pull-down circuit 16.

Each of the pull-up gate circuits 14a through 14n are identical in construction. The gate circuit 14a is comprised of a pull-up P-channel MOS transistor P1, a pull-down N-channel MOS transistor N1, and a pull-up NPN-type bipolar transistor Q1. The P-channel transistor P1 has its source connected to a supply potential or voltage VCC, which is typically at +5.0 volts. The gate of the transistor P1 is connected to the gate of the N-channel transistor N1. The common gates of the transistors P1 and N1 are also connected to receive an input logic signal VI1. The drain of the transistor P1 is connected to the drain of the N-channel transistor N1. The source of the transistor N1 is connected to a ground potential. The bipolar transistor Q1 has its collector connected to the supply potential VCC, its base connected to the common drains of the transistors P1 and N1, and its emitter connected to a common emitter node A. The common emitter node A is connected to the line 12 for providing the decoded output signal V∅.

Similarly, the gate circuit 14n is comprised of a pull-up P-channel MOS transistor Pn, a pull-down N-channel MOS transistor Nn, and a pull-up NPN-type bipolar transistor Qn. The P-channel transistor Pn has its source connected to the supply potential VCC. The gate of the transistor Pn is connected to the gate of the N-channel transistor Nn. The common gates of the transistors Pn and Nn are also connected to receive an input logic signal VIn. The drain of the transistor Pn is connected to the drain of the N-channel transistor Nn. The source of the transistor Nn is connected to the ground potential. The bipolar transistor Qn has its collector connected to the supply potential VCC, its base connected to the common drains of the transistor Pn and Nn, and its emitter connected to the common emitter node A.

The pull-down circuit 16 is formed of a single pull-down N-channel MOS transistor N∅. The N-channel transistor N∅ has its drain connected to the emitters of the bipolar transistor Q1 through Qn at the common node A. The gate of the N-channel transistor N∅ is connected to the supply potential VCC. The transistor N∅ serves as a regulated current source and is always rendered to be conductive. Alternatively, the base of the transistor N∅ may be connected to a CMOS gate-controlling voltage $V_R$ so as to yield a well-controlled current which is substantially independent of variations in temperature, power supply voltage and process corners. The gate-controlling voltage $V_R$ may be generated from a regulator circuit.

The pull-up gate circuits 14a–14n of the present decoder circuit are designed to produce stronger pull-up currents than the pull-down current provided by the pull-down transistor N∅. Each of the input logic signals VI1 through VIn swings between, the supply potential VCC (high) and the ground potential (low). If any one of the input logic signals VI1 through VIn is low, its corresponding pull-down N-channel transistors N1 . . . Nn will be turned off. Further, the corresponding pull-up P-channel transistors P1 . . . Pn and pull-up bipolar transistors Q1 . . . Qn will be turned on so as to over-power the pull-down current supplied by the current source transistor N∅. As a result, the decoded output signal V∅ will be at a high logic level, i.e., non-selected condition. The decoded output signal V∅ will be at a low logic level when selected; this occurs only when all of the input logic signals VI1 through VIn are at a high logic level. When the input signals are at this high level, the corresponding pull-down N-channel transistors N1 . . . Nn are turned on and the corresponding pull-up transistors P1 . . . Pn and Q1 . . . Qn are turned off.

It should be noted that when the input signals are low the corresponding pull-up P-channel MOS transistors P1 . . . Pn serve to supply pull-up base current to the respective bipolar transistors Q1 . . . Qn. Since the pull-up base current is amplified by the bipolar transistor, the size of the pull-up MOS transistor P1 . . . Pn can be made smaller than the size of the pull-down transistor N∅ and yet still provide the strong pull-up current capability. Further, it should be clear that the relatively low capacitance at the drains of the transistors N1 . . . Nn are decoupled or isolated from the high load capacitance at the line 12 by the current gain of the corresponding bipolar transistors Q1 . . . Qn. Thus, the pull-down N-channel transistors N1 . . . Nn are used to pull down only the corresponding base nodes of the respective bipolar transistors Q1 . . . Qn and therefore their sizes can be made small compared to the sizes of the pull-up P-channel MOS transistors P1 . . . Pn without affecting the pull-down operation.

As should be apparent to those skilled in the art, the noise margin has been increased due to the series connection of the P-channel MOS transistors P1 . . . Pn and the corresponding bipolar transistors Q1 . . . Qn. Therefore, the trip point of the input signals for the pull-up circuits 14a . . . 14n can be freely adjusted without adversely affecting the operation of the decoder circuit. Consequently, high noise immunity is achieved even when there are a large number of inputs. Moreover, the base nodes of the pull-up bipolar transistors Q1 . . . Qn are designed to go low fast enough so that it will not clamp the pull-down transistor N∅. As a result, the pull-down speed is essentially determined by the capacitive loading at the common node A and the pull-down current source transistor N∅.

Figure 2:
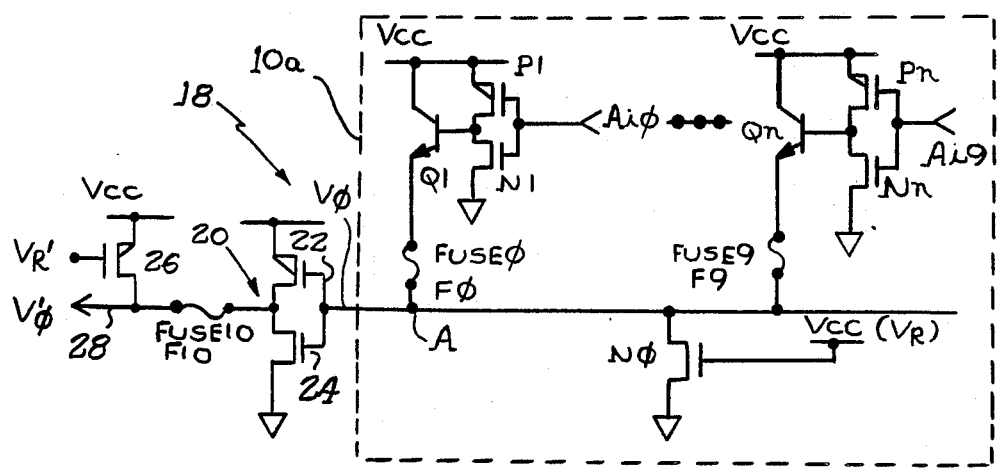
FIG. 2 is a schematic circuit diagram of a redundancy type circuit device which incorporates the bipolar/CMOS decoder circuit of the present invention.

One particular application for the decoder circuit of the present invention is for use in redundancy type decoders. For example, there is illustrated in FIG. 2 a schematic circuit diagram of a 10-input redundant decoder 18 which incorporates the bipolar/CMOS decoder 10a of the present invention. The decoder circuit 10a is substantially identical to the decoder circuit 10 of FIG. '1 except for the additional fuses F∅. . . F9 connected to the respective emitters of the bipolar transistors Q1 . . . Qn. The input logic signals Ai∅. . . Ai9 are from the outputs of address buffers, (not shown).

The redundant decoder circuit 18 further includes a CMOS inverter 20 formed of a P-channel transistor 22 and an N-channel transistor 24, a pull-up P-channel transistor 26, and a fuse F10. The output signal V∅ from the decoder circuit 10a is connected to the input of the inverter 20. The fuse F10 is interconnected between the output of the inverter 20 and the drain of the pull-up P-channel transistor 26. The drain of the transistor 26 is also connected to line 28 to generate a decoded output signal V'∅.

From the foregoing detailed description, it can thus be seen that the present invention provides a bipolar/CMOS decoder circuit for generating a decoded output signal. The decoder circuit of the present invention has a high noise margin and low pattern insensitivity even with a large number of inputs.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A bipolar/CMOS decoder circuit comprising:

a plurality of pull-up gate circuits (14a), each of said gate circuits being formed of a pull-up P-channel MOS transistor (P1), a pull-down N-channel MOS transistor (N1), and a pull-up bipolar transistor (Q1);

said pull-up P-channel transistor (P1) having its source connected to a supply potential (VCC), its gate connected to the gate of said pull-down N-channel transistor (N1), and its drain connected to the drain of said pull-down N-channel transistor (N1), said pull-down N-channel transistor (N1) having its source connected to a ground potential, said common gates of said P-channel and N-channel transistor (P1, N1) being connected to receive an input logic signal;

said pull-up bipolar transistor (Q1) having its collector connected to the supply potential (VCC), its base connected to the common drains of said P-channel and N-channel transistors (P1, N1), and its emitter connected to a common emitter node for providing a decoded output signal; and a pull-down circuit (16) formed of a single pull-down current source N-channel MOS transistor (N∅), said current source N-channel transistor (N∅) having its drain connected to the common emitter node, its gate connected to a voltage source, and its source connected to the ground potential.

2. A decoder circuit as claimed in claim 1, wherein said bipolar transistor (Q1) is of the NPN-type conductivity.

3. A decoder circuit as claimed in claim 1, wherein said voltage source is the supply potential (VCC).

4. A decoder circuit as claimed in claim 1, wherein said voltage source is a CMOS reference voltage ($V_R$).

5. A decoder circuit as claimed in claim 1, wherein said pull-up P-channel transistor (P1) is smaller in size than said current source transistor (NØ).

6. A decoder circuit as claimed in claim 5, wherein said pull-down N-channel transistor (N1) is smaller in size than said pull-up transistor (P1).

7. A bipolar/CMOS decoder circuit comprising:
at least one pull-up gate circuit (14a), said gate circuit being formed of a pull-up P-channel MOS transistor (P1), a pull-down N-channel MOS transistor (N1), and a pull-up bipolar transistor (Q1);
said pull-up P-channel transistor (P1) having its source connected to a supply potential (VCC), its gate connected to the gate of said pull-down N-channel transistor (N1), and its drain connected to the drain of said pull-down N-channel transistor (N1), said pull-down N-channel transistor (N1) having its source connected to a ground potential, said common gates of said P-channel and N-channel transistors (P1, N1) being connected to receive an input logic signal;
said pull-up bipolar transistor (Q1) having its collector connected to the supply potential (VCC), its base connected to the common drains of said P-channel and N-channel transistors (P1, N1), and its emitter connected to a common emitter node for providing a decoded output signal; and
a pull-down circuit (16) formed of a single pull-down current source N-channel MOS transistor (NØ), said current source N-channel transistor (NØ) having its drain connected to the common emitter node, its gate connected to a voltage source, and its source connected to the ground potential.

8. A decoder circuit as claimed in claim 7, wherein said bipolar transistor (Q1) is of the NPN-type conductivity.

9. A decoder circuit as claimed in claim 7, wherein said voltage source is the supply potential (VCC).

10. A decoder circuit as claimed in claim 7, wherein said voltage source is a CMOS reference voltage ($V_R$).

* * * * *